(12) United States Patent
Teuschler et al.

(10) Patent No.: US 7,972,963 B2
(45) Date of Patent: Jul. 5, 2011

(54) POLISHED SEMICONDUCTOR WAFER AND PROCESS FOR PRODUCING IT

(75) Inventors: Thomas Teuschler, Burghausen (DE); Guenter Schwab, Neuoetting (DE); Maximilian Stadler, Haiming (DE)

(73) Assignee: Siltronic AG, Munich (DE)

( * ) Notice: Subject to any disclaimer, the term of this patent is extended or adjusted under 35 U.S.C. 154(b) by 484 days.

(21) Appl. No.: 11/703,458

(22) Filed: Oct. 11, 2007

(65) Prior Publication Data
US 2008/0057714 A1    Mar. 6, 2008

Related U.S. Application Data

(62) Division of application No. 10/762,111, filed on Jan. 21, 2004, now abandoned.

(30) Foreign Application Priority Data

Jan. 23, 2003 (DE) .................................. 103 02 611

(51) Int. Cl.
*H01L 21/461* (2006.01)
(52) U.S. Cl. ......... 438/691; 257/E21.214; 257/E21.219; 257/E21.482
(58) Field of Classification Search .................. None
See application file for complete search history.

(56) References Cited

U.S. PATENT DOCUMENTS

| | | | |
|---|---|---|---|
| 4,838,289 A * | 6/1989 | Kottman et al. .............. | 134/153 |
| 4,903,717 A * | 2/1990 | Sumnitsch .................... | 134/99.1 |
| 5,451,267 A | 9/1995 | Stadler et al. | |
| 5,474,644 A | 12/1995 | Kato et al. | |
| 5,845,662 A * | 12/1998 | Sumnitsch .................... | 134/153 |
| 5,916,366 A * | 6/1999 | Ueyama et al. ................. | 118/52 |
| 5,945,351 A * | 8/1999 | Mathuni ....................... | 438/706 |
| 5,993,547 A * | 11/1999 | Sato ............................... | 118/50 |
| 6,030,887 A * | 2/2000 | Desai et al. ................... | 438/507 |
| 6,063,232 A * | 5/2000 | Terasawa et al. ......... | 156/345.23 |

(Continued)

FOREIGN PATENT DOCUMENTS

DE        100 02 354        8/2001

(Continued)

OTHER PUBLICATIONS

Patent Abstract of Japan corresponding to JP6-084881.

(Continued)

*Primary Examiner* — Allan Olsen
(74) *Attorney, Agent, or Firm* — Brook Kushman P.C.

(57) ABSTRACT

A polished semiconductor wafer has a front surface and a back surface and an edge R, which is located at a distance of a radius from a center of the semiconductor wafer, forms a periphery of the semiconductor wafer and is part of a profiled boundary of the semiconductor wafer. The maximum deviation of the flatness of the back surface from an ideal plane in a range between R-6 mm and R-1 mm of the back surface is 0.7 μm or less. A process for producing the semiconductor wafer, comprises at least one treatment of the semiconductor wafer with a liquid etchant and at least one polishing of at least a front surface of the semiconductor wafer, the etchant flowing onto a boundary of the semiconductor wafer during the treatment, and the boundary of the semiconductor wafer which faces the flow of etchant being at least partially shielded from being struck directly by the etchant. The shielding extends in the direction of a thickness d of the semiconductor wafer and is at least d+100 μm long.

8 Claims, 12 Drawing Sheets

Example 7

U.S. PATENT DOCUMENTS

| | | | | |
|---|---|---|---|---|
| 6,136,163 | A * | 10/2000 | Cheung et al. | 204/198 |
| 6,162,739 | A * | 12/2000 | Sumnitsch et al. | 438/745 |
| 6,413,436 | B1 * | 7/2002 | Aegerter et al. | 216/13 |
| 6,458,688 | B1 | 10/2002 | Wenski et al. | |
| 6,632,292 | B1 * | 10/2003 | Aegerter et al. | 134/33 |
| 6,861,360 | B2 | 3/2005 | Wenski et al. | |
| 6,875,284 | B2 * | 4/2005 | Scranton | 134/1 |
| 6,899,762 | B2 | 5/2005 | Wenski et al. | |
| 7,000,622 | B2 * | 2/2006 | Woods et al. | 134/94.1 |
| 7,037,853 | B2 * | 5/2006 | Hongo et al. | 438/745 |
| 7,193,295 | B2 * | 3/2007 | Dolechek et al. | 257/619 |
| 7,288,489 | B2 * | 10/2007 | Dolechek et al. | 438/745 |
| 7,350,315 | B2 * | 4/2008 | Davis et al. | 34/92 |
| 7,354,649 | B2 * | 4/2008 | Dolechek et al. | 428/446 |
| 7,399,713 | B2 * | 7/2008 | Aegerter et al. | 438/745 |
| 7,584,761 | B1 * | 9/2009 | Yun et al. | 134/99.1 |
| 7,625,821 | B2 * | 12/2009 | Dolechek et al. | 438/690 |
| 2002/0113039 | A1 * | 8/2002 | Mok et al. | 216/92 |
| 2003/0070695 | A1 * | 4/2003 | Emami et al. | 134/33 |
| 2004/0023494 | A1 * | 2/2004 | Aegerter et al. | 438/689 |
| 2004/0035448 | A1 * | 2/2004 | Aegerter et al. | 134/33 |
| 2005/0217707 | A1 * | 10/2005 | Aegerter et al. | 134/33 |
| 2006/0004542 | A1 * | 1/2006 | Koliopoulos et al. | 702/182 |
| 2006/0040086 | A1 * | 2/2006 | Dolechek et al. | 428/64.1 |
| 2006/0046499 | A1 * | 3/2006 | Dolechek et al. | 438/745 |
| 2006/0118515 | A1 * | 6/2006 | Dolechek et al. | 216/52 |
| 2008/0063853 | A1 * | 3/2008 | Dolechek et al. | 428/220 |
| 2008/0293253 | A1 * | 11/2008 | Itzkowitz | 438/745 |

FOREIGN PATENT DOCUMENTS

| | | |
|---|---|---|
| DE | 100 64 081 | 6/2002 |
| DE | 102 15 960 | 10/2002 |
| EP | 1 119 031 | 1/2001 |
| JP | 6-084881 | 3/1994 |
| JP | 200745583 A | 2/1995 |
| JP | 2001250808 | 9/2001 |

OTHER PUBLICATIONS

English Derwent Abstract corresponding to EP 111 9031 (AN 2002-207693).

English Derwent Abstract corresponding to DE 10064081 (AN 2002-228281).

English Derwent Abstract corresponding to DE 102 15 960 (AN 2003-020868).

Patent Abstract of Japan corresponding to JP6-084881, (Mar. 25, 1994).

* cited by examiner

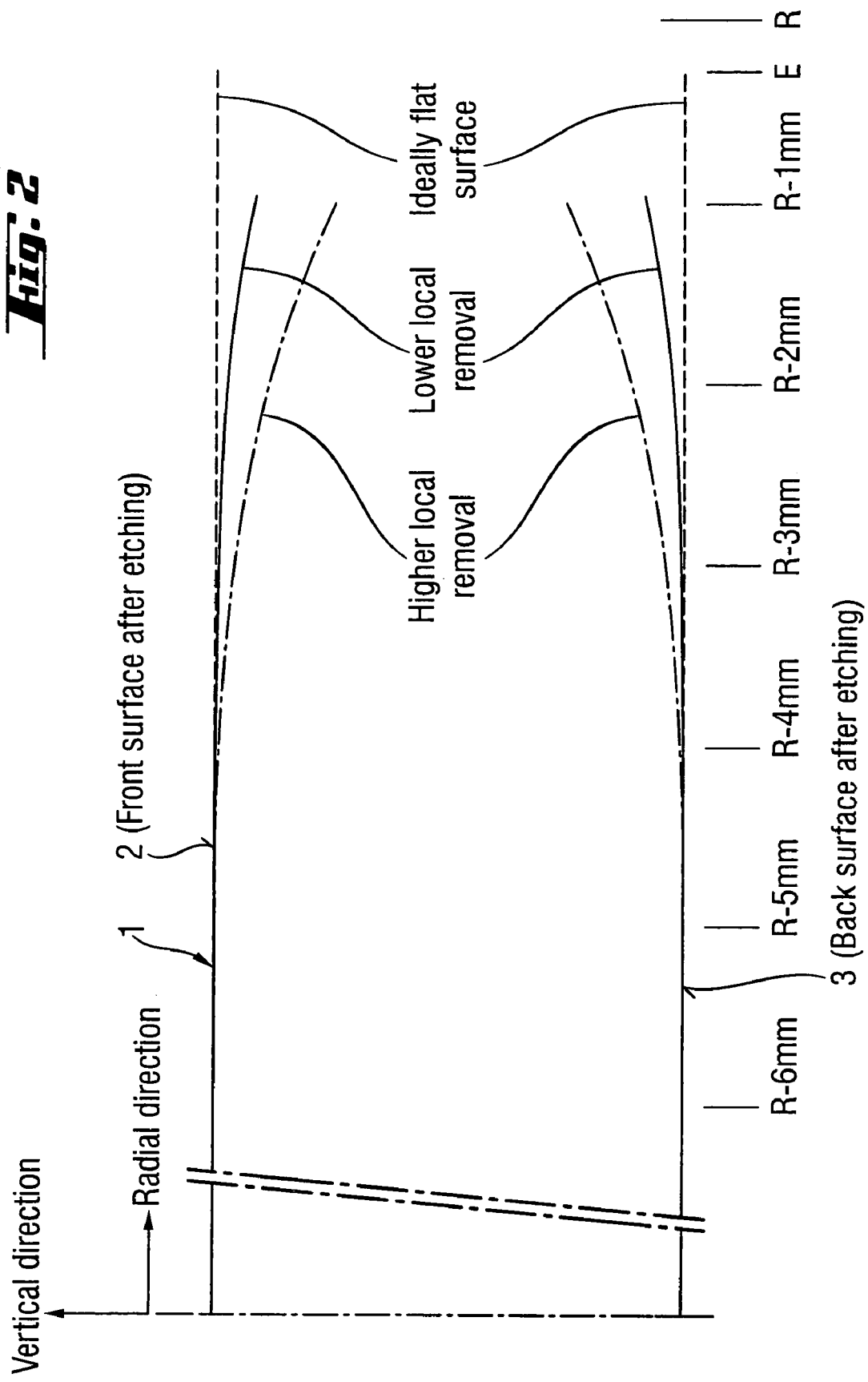

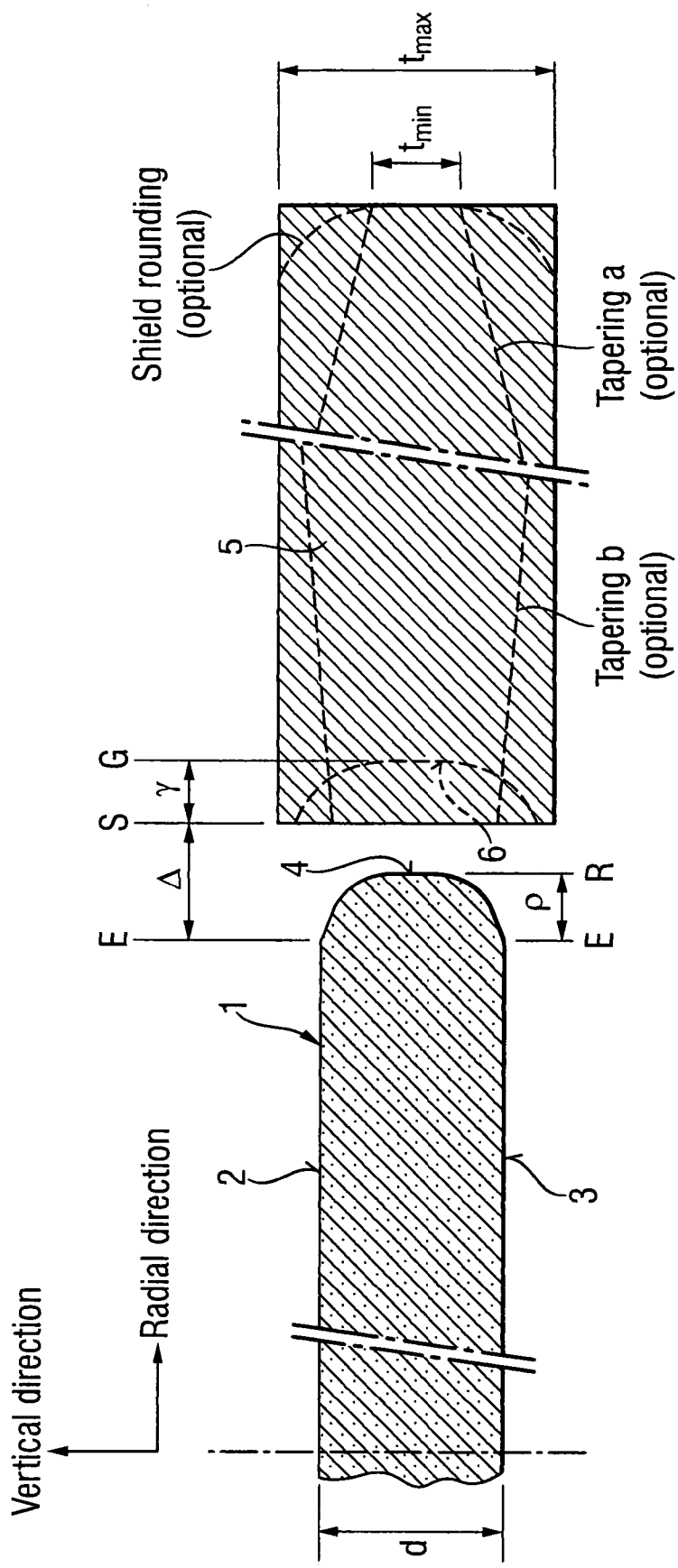

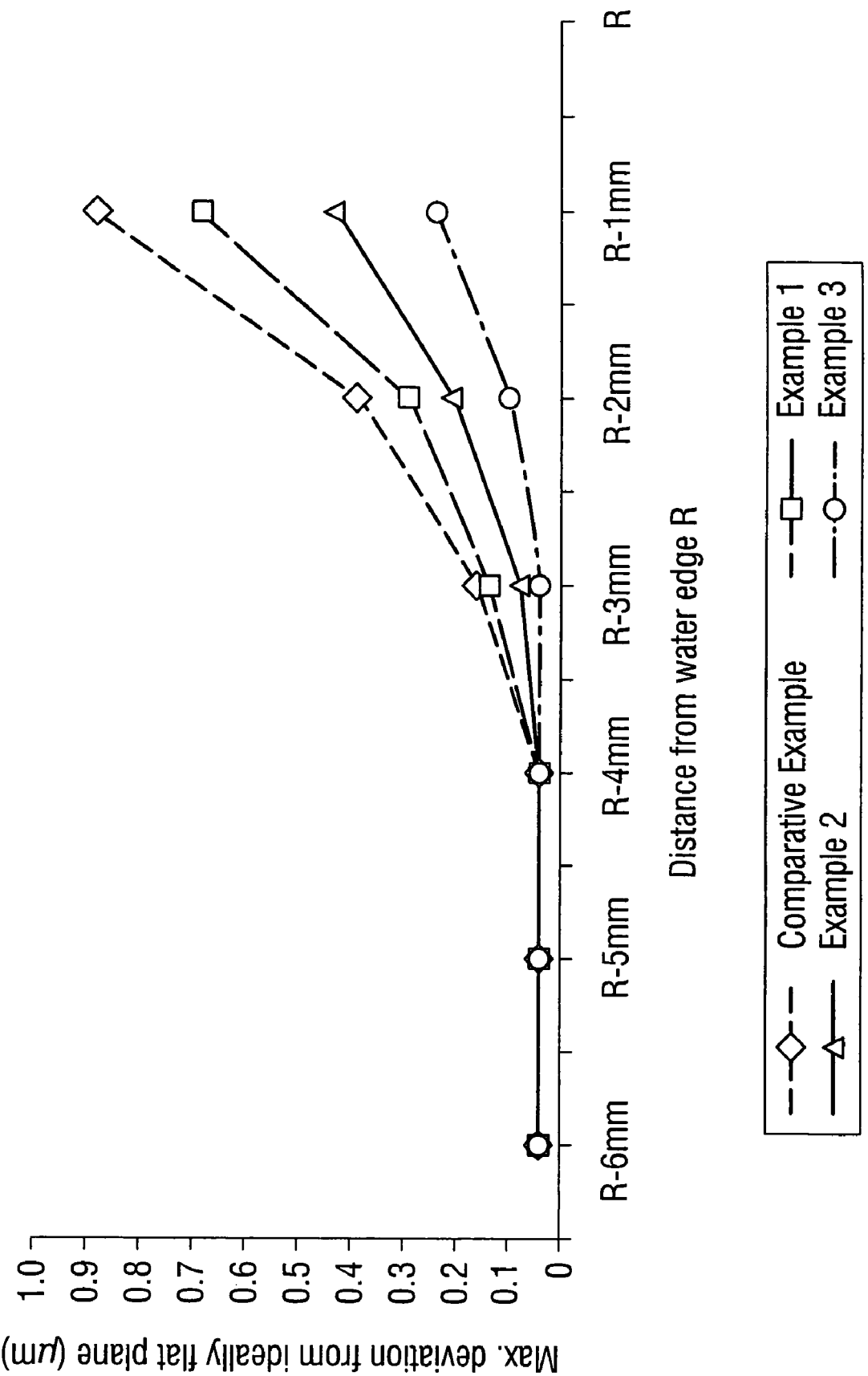

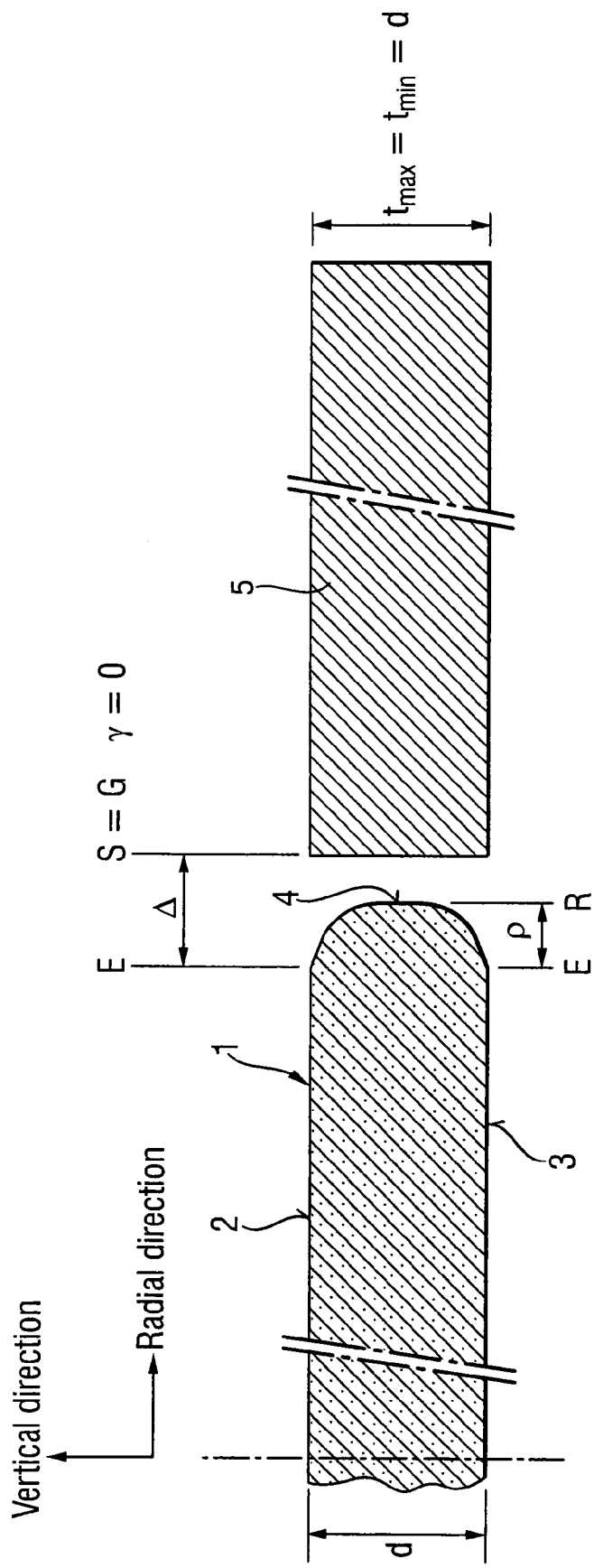
Fig. 5: Comparative Example

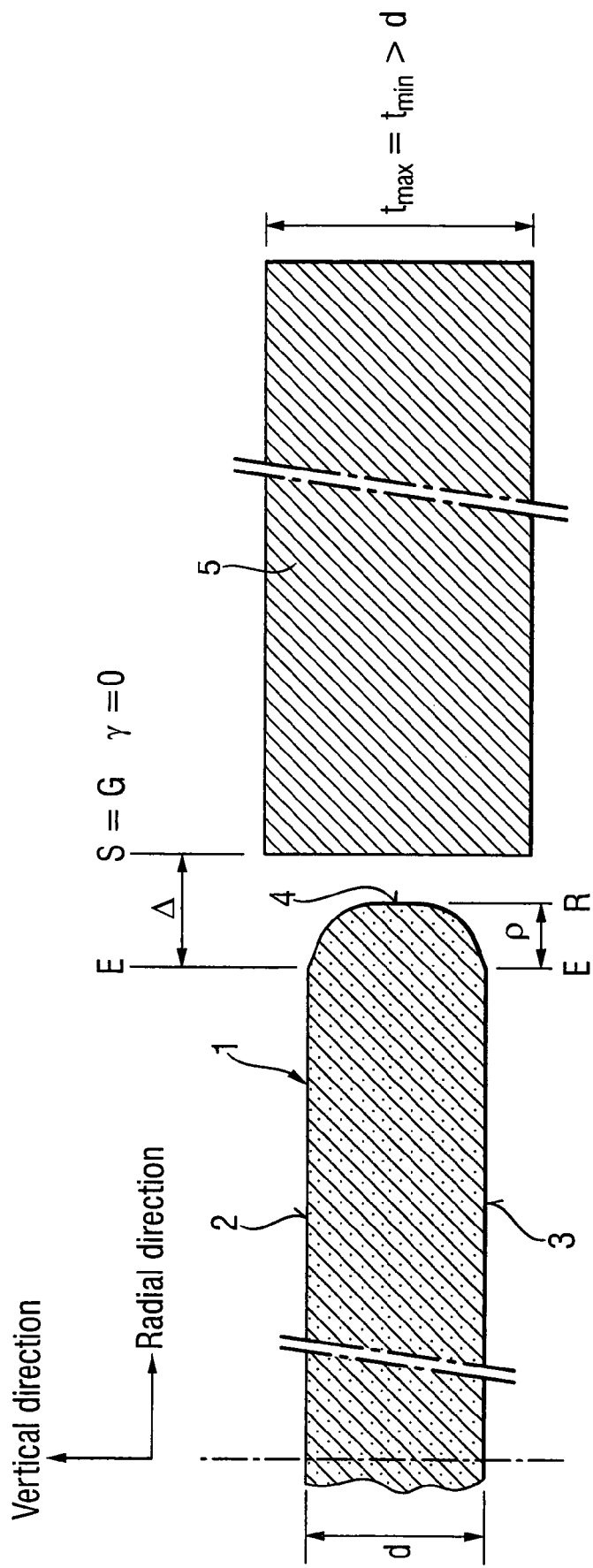
Fig. 6: Example 1, 2

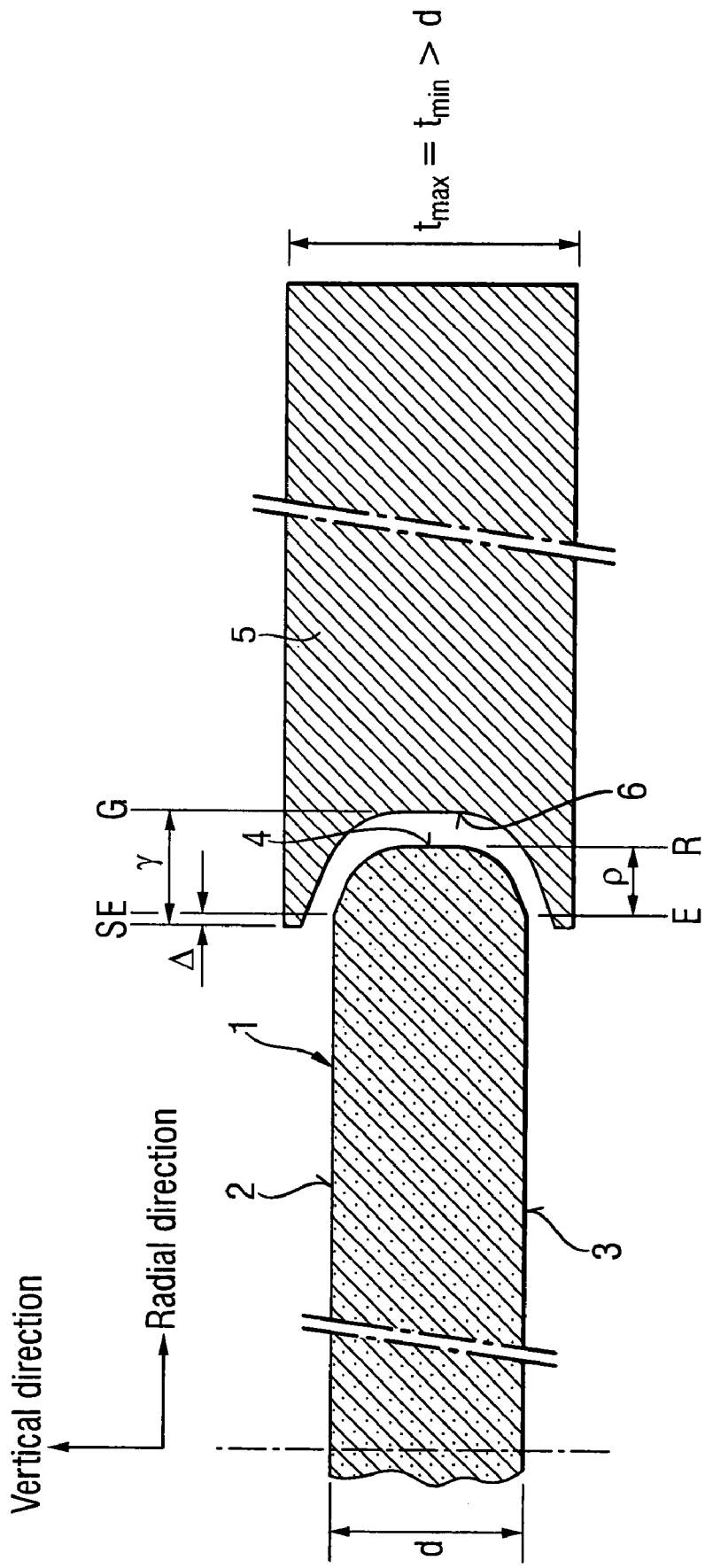
Fig. 7: Example 3

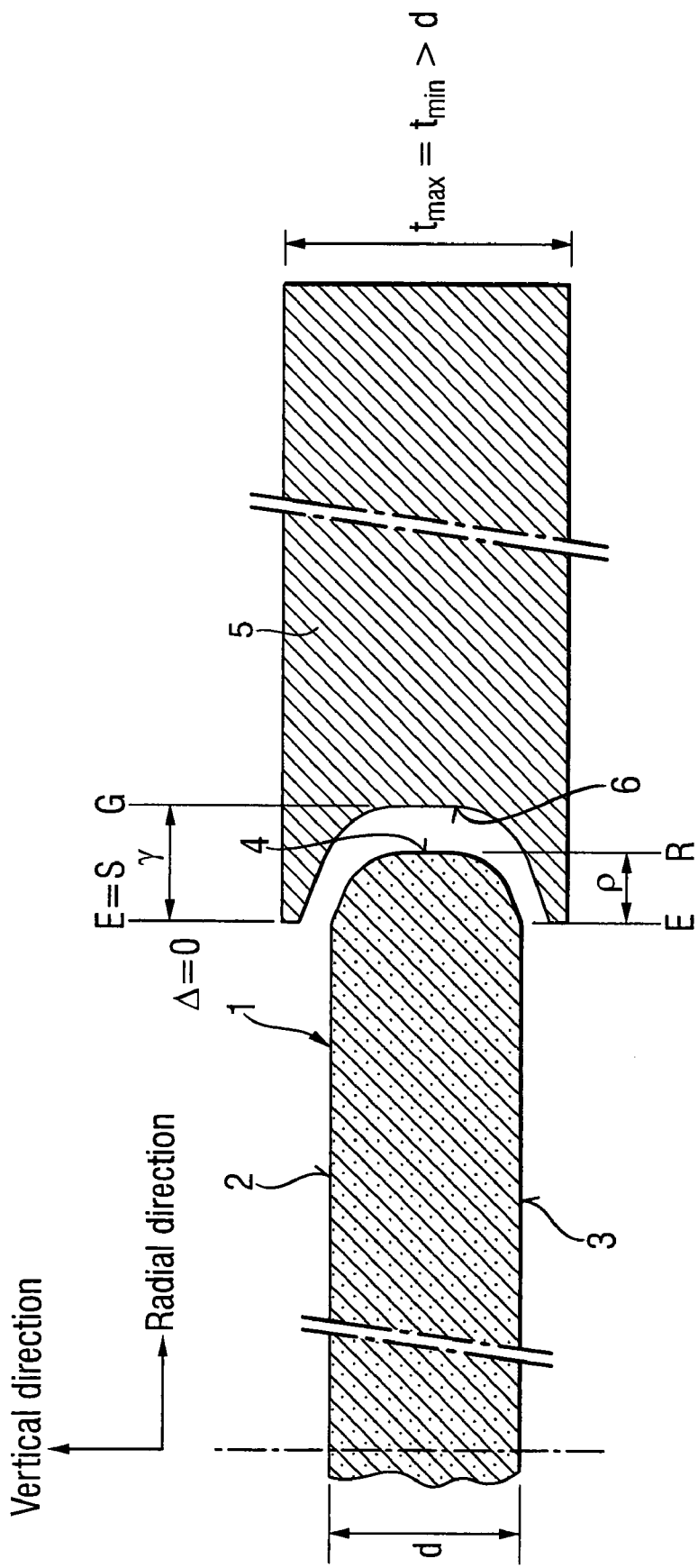
Fig. 8: Example 4

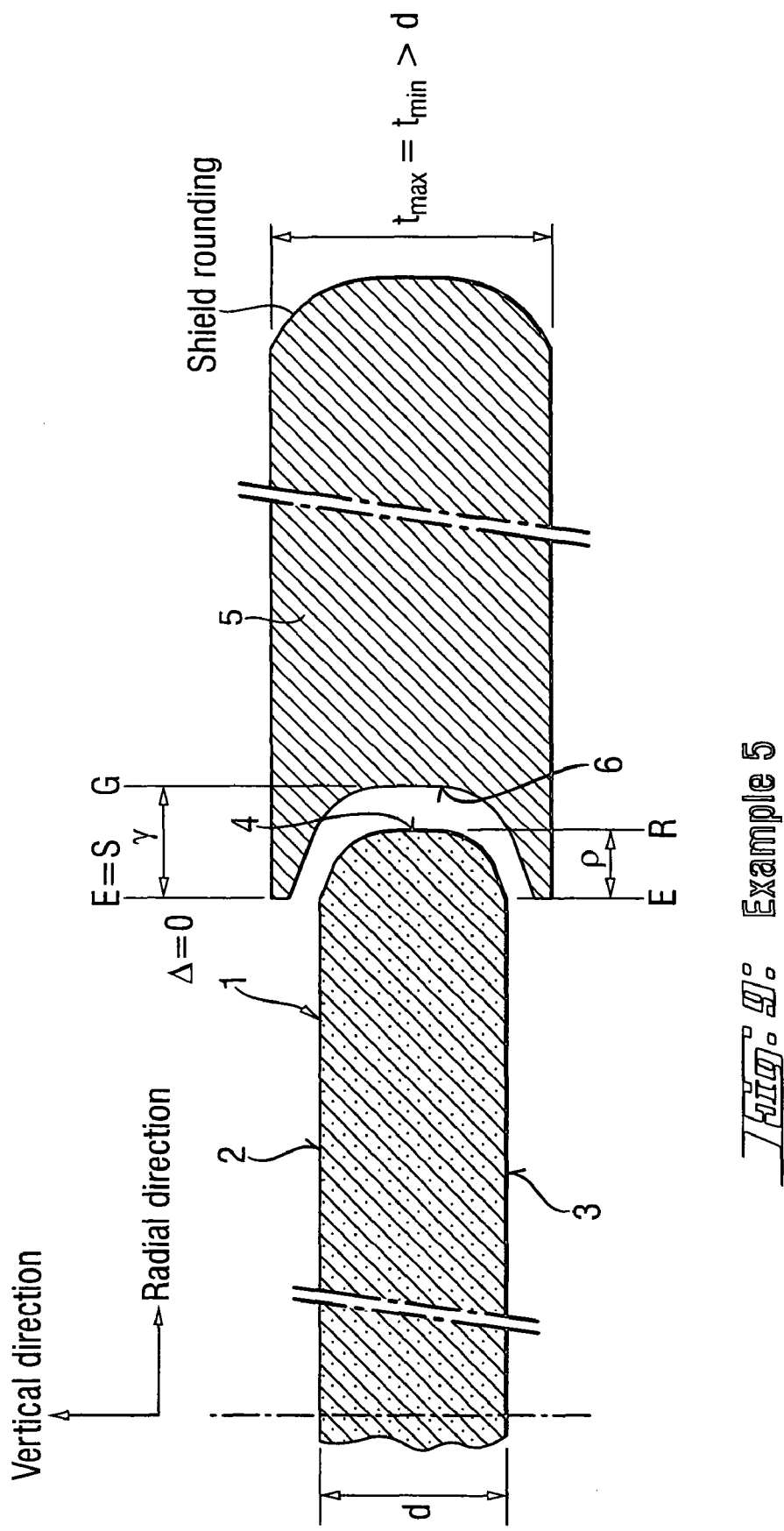
Fig. 9: Example 5

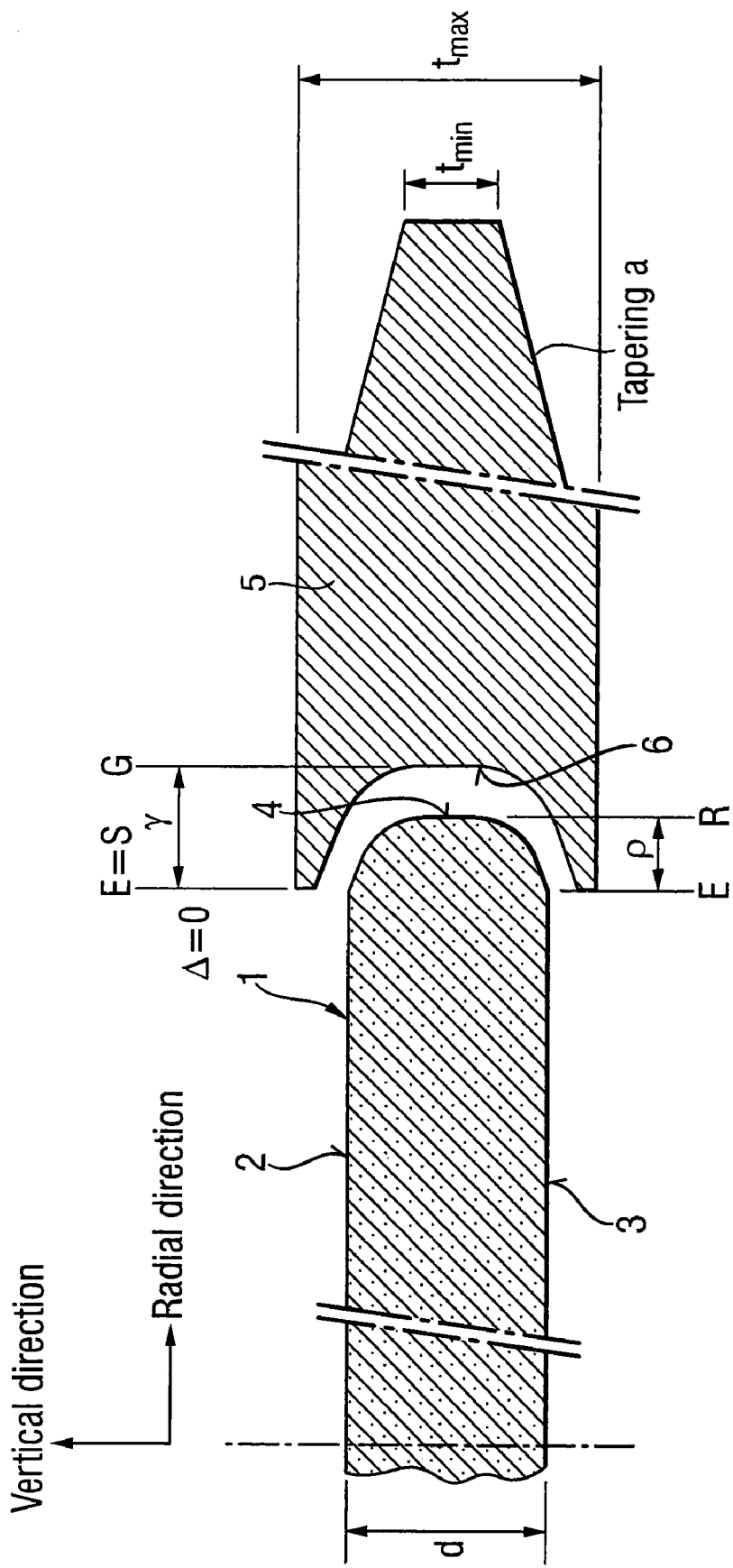

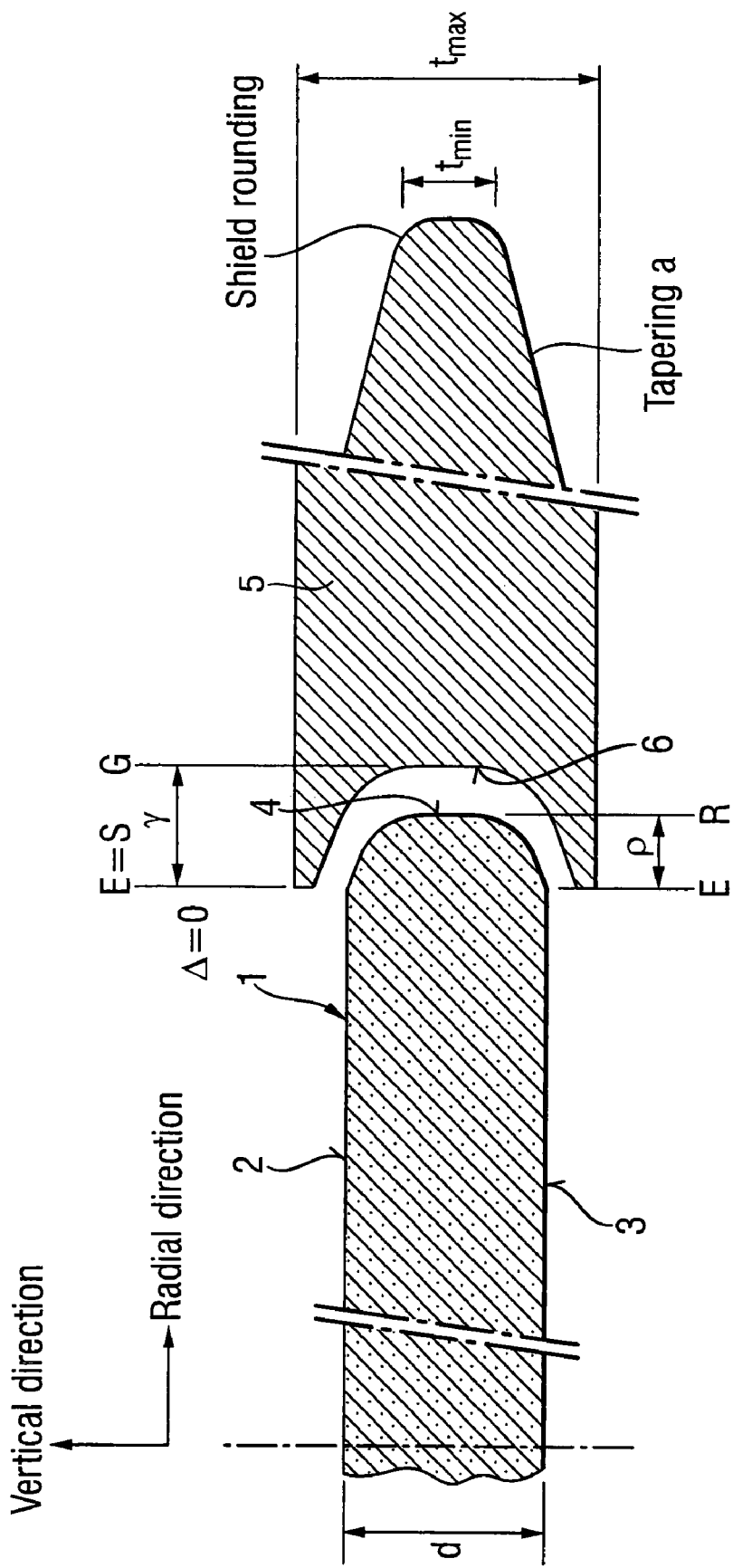
Fig. 11: Example 7

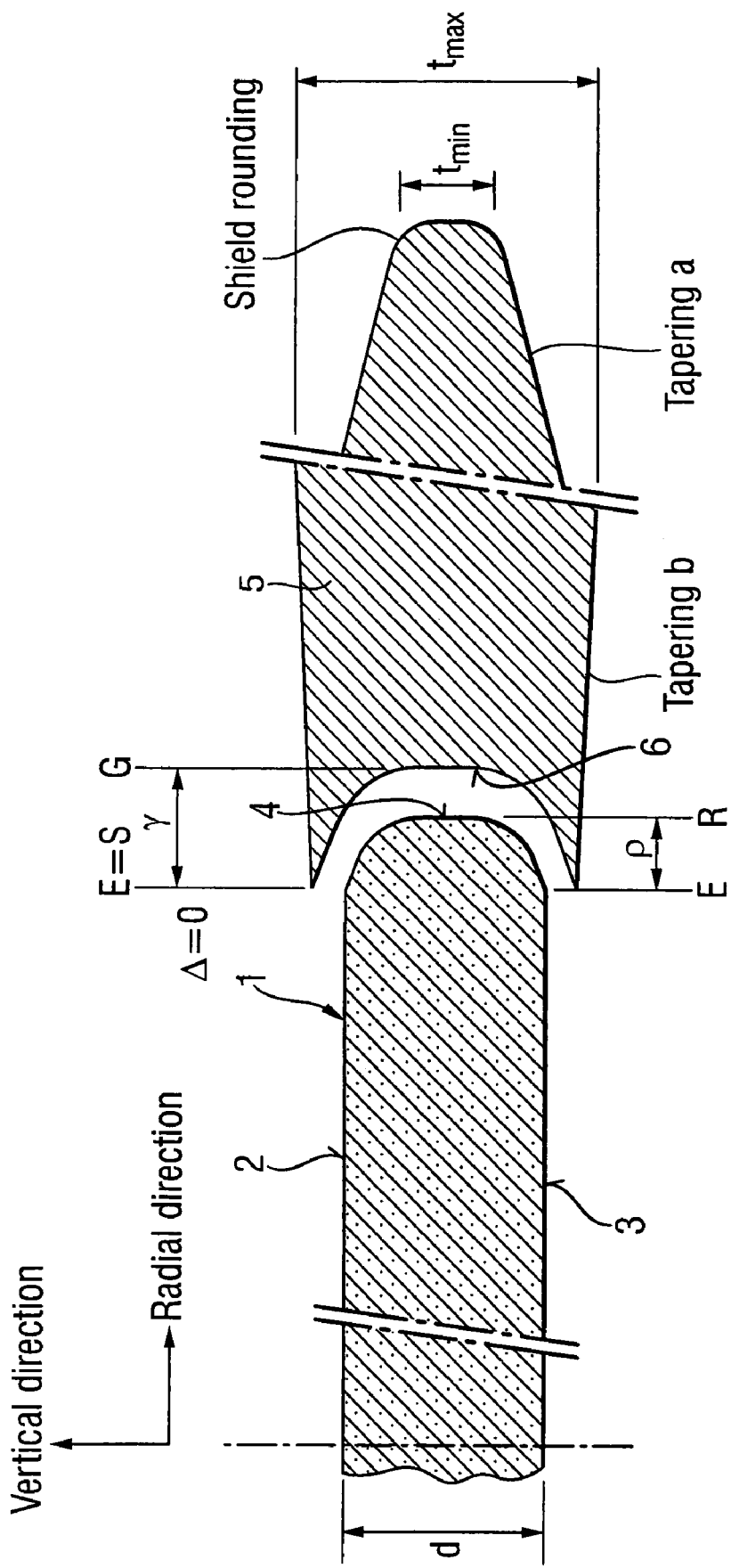
Fig. 12: Example 8

POLISHED SEMICONDUCTOR WAFER AND PROCESS FOR PRODUCING IT

BACKGROUND OF THE INVENTION

1. Field of the Invention

The invention relates to a polished semiconductor wafer for the fabrication of electronic components, having a front surface and a back surface and an edge which forms the periphery of the semiconductor wafer and is part of a profiled boundary of the semiconductor wafer. The semiconductor wafer has a polished front surface, into which the components are formed. Strict demands are imposed on the flatness of the front surface, and these demands are extraordinarily high if it is intended to accommodate electronic structures with line widths of 0.1 μm or below (≦0.1 μm technology). To enable the maximum number of circuits of this type to be integrated, it is necessary to ensure the required flatness to as close as possible to the edge of the front surface.

2. The Prior Art

Most efforts to increase the flatness of the side faces of the semiconductor wafer in general and the front surface in particular have consistently been concentrated on substeps involved in the production of a semiconductor wafer which influence the flatness. These substeps include in particular steps such as the lapping and/or grinding and polishing of one or both side faces. At least one polishing step, carried out as a single-side or double-side polishing step, is virtually always carried out. As is made clear by European Patent No. EP 1119031 A2, however, it is also possible for substeps such as the etching of the side faces to have an effect on the flatness, in particular on the flatness in the edge region of the side faces. A semiconductor wafer is usually etched prior to a first polishing step, in order to remove damage from the surface left behind by a previous shaping operation, for example by grinding and/or lapping of the semiconductor wafer. The abovementioned patent application states that a raised portion in the edge region of the polished front surface of the semiconductor wafer is likely if the semiconductor wafer is exposed to a flow of a liquid etchant which is guided onto the boundary of the semiconductor wafer during etching. To avoid this effect, a shield can be positioned in front of the boundary of the semiconductor wafer preventing the etchant from being able to strike the boundary of the semiconductor wafer directly. The document does not give any indications with regard to any potential for targeted influencing of the flatness of a semiconductor wafer in its edge region, in particular with a view to making the semiconductor wafer suitable for the ≦0.1 μm technology.

SUMMARY OF THE INVENTION

It is therefore an object of the present invention to demonstrate such potential.

It has been found that the flatness that can be achieved by polishing in the edge region of a semiconductor wafer can be influenced in a targeted fashion by prior etching of the semiconductor wafer. This is a surprising result, since hitherto it was assumed, even when using the process disclosed by EP 1119031 A2, that the semiconductor wafer geometry is adversely affected by the etching and that it will only be possible to partially eliminate this adverse effect by optimized polishing.

The invention comprises a polished semiconductor wafer having a front surface and a back surface and an edge R, which is located at a distance of a radius from a center of the semiconductor wafer, forms a periphery of the semiconductor wafer and is part of a profiled boundary of the semiconductor wafer. A maximum deviation of the flatness of the back surface from an ideal plane in a range between R-6 mm and R-1 mm of the back surface is 0.7 μm or less.

This particular geometry of the back surface of the semiconductor wafer is an essential feature for making the semiconductor wafer suitable for the ≦0.1 μm technology. This result was likewise unexpected, since the flatness of the front surface forms the focal point of interest with regard to possible minimum line widths of electronic structures. Furthermore, the inventors have established that when producing a semiconductor wafer having this particular, it is essential for the etching step to be carried out in a certain way prior to a first polishing step.

The invention also includes a process for producing a polished semiconductor wafer, comprising at least one treatment of the semiconductor wafer with a liquid etchant and at least one polishing of at least a front surface of the semiconductor wafer, the etchant flowing onto a boundary of the semiconductor wafer during the treatment, and the boundary of the semiconductor wafer which faces the flow of etchant being at least partially shielded from being struck directly by the etchant. The boundary of the semiconductor wafer is shielded along a distance which extends in the direction of a thickness d of the semiconductor wafer and is at least d+100 μm long.

Carrying out the etching step in this process results in a semiconductor wafer whose front surface and back surface are particularly planar all the way to the edge region. The flatness of at least the front surface is optimized during the subsequent polishing, with the improved flatness of the back surface being responsible for this being possible, since the flatness of the front surface of a semiconductor wafer can scarcely be improved by a polishing step if the flatness of the back surface of the semiconductor wafer is relatively moderate. It is essential to the invention for the boundary of the semiconductor wafer which faces the flow of etchant to be at least partially shielded from the etchant flowing in. It is also essential for the shielding action to cover a region before the boundary of the semiconductor wafer which, as seen in a direction perpendicular to the direction of flow of the etchant and parallel to the thickness of the semiconductor wafer, is at least of a length which corresponds to the sum of the thickness of the semiconductor wafer and a length of 100 μm.

Therefore, the subject matter of the invention is also an arrangement comprising a semiconductor wafer and a shield which is positioned in front of a boundary of the semiconductor wafer and at least partially shields the boundary of the semiconductor wafer from a liquid etchant flowing onto the boundary. The boundary of the semiconductor wafer has a profile which extends from an inner profile end E, over a length ρ, to an edge R of the semiconductor wafer. The edge is located at a distance of a radius from a center of the semiconductor wafer and forms a periphery of the semiconductor wafer. The shield has a border S which is closest to the boundary of the semiconductor wafer and is at a distance Δ from the inner profile end E and a border lying furthest from the boundary of the semiconductor wafer. The shield shielding the boundary of the semiconductor wafer which faces the flow of etchant along a distance which extends in the direction of a thickness d of the semiconductor wafer is at least d+100 μm long.

BRIEF DESCRIPTION OF THE DRAWINGS

Other objects and features of the present invention will become apparent from the following detailed description considered in connection with the accompanying drawings. It is to be understood, however, that the drawings are designed as an illustration only and not as a definition of the limits of the invention.

In the drawings, wherein similar reference characters denote similar elements throughout the several views:

FIG. 2 diagrammatically depicts an edge region of the semiconductor wafer and relates this region to an ideal plane;

FIG. 3 shows, in general form, the arrangement according to the invention of the semiconductor wafer and the shield;

FIG. 4 uses a diagram based on a comparative example and three examples to demonstrate the effect of the invention on the flatness of the back surface of a semiconductor wafer in the edge region; and FIGS. 5 to 12 show various embodiments of the arrangement of the semiconductor wafer and the shield during the etching of the semiconductor wafer; the arrangement shown in FIG. 5 forms part of the prior art.

DETAILED DESCRIPTION OF THE PREFERRED EMBODIMENT

Figure 1:
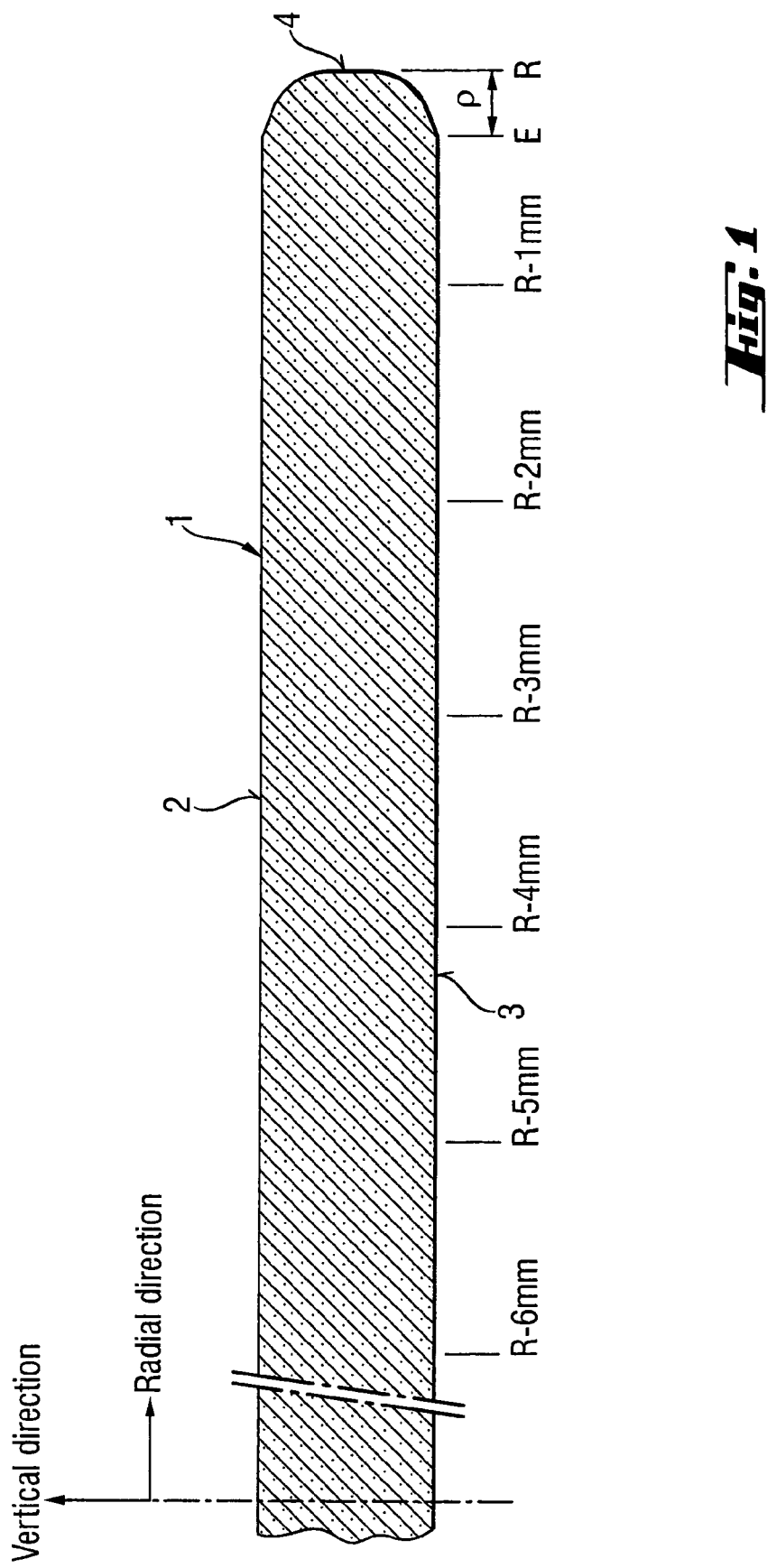
FIG. 1 shows a sectional view of a portion of a semiconductor wafer.

FIG. 1 shows the edge region of a silicon semiconductor wafer, since the invention has the effect of improving the flatness of this region. The semiconductor wafer 1 is illustrated in conjunction with a two-dimensional system of coordinates, with the aid of which the relative position of the semiconductor wafer and the shield can subsequently be clarified. The reference point for the system of coordinates is the center of the semiconductor wafer, which is rotated about this center during etching. The edge R of the semiconductor wafer is located at a distance of a radius from the center and forms the periphery of the semiconductor wafer. It is part of a profiled boundary 4 of the semiconductor wafer, the profile being produced mechanically using a shaping tool, for example a profile grinding wheel, in what is known as an edge rounding step. The location of the profile which is closest to the center is marked as the inner profile end E. The boundary of the semiconductor wafer may be rounded symmetrically or asymmetrically. The edge region of the semiconductor wafer, which is of particular interest in connection with the invention, is located at a distance R-1 mm to R-6 mm from the center of the semiconductor wafer, on the front surface 2 and the back surface 3 of the semiconductor wafer.

During the etching, the semiconductor wafer, which preferably substantially comprises silicon, is exposed to a flow of liquid etchant which flows to the boundary of the semiconductor wafer at a defined velocity parallel to the radial direction shown in the system of coordinates. Suitable etchants are both alkaline and acid reacting solutions. However, acid reacting solutions are preferred, since the risk that they will introduce metallic impurities into the semiconductor material is much lower. A particularly preferred etchant contains aqueous hydrogen fluoride solution and at least one oxidizing acid, particularly preferably nitric acid, and, if appropriate, further additives. It is also particularly preferred for small gas bubbles to be dispersed in the etchant in order to make the removal of material by etching more uniform. This can be realized, for example, in accordance with the description given in U.S. Pat. No. 5,451,267, the disclosure of which is herein incorporated by reference.

The boundary of the semiconductor wafer which faces the flow of etchant is to be at least partially shielded in the manner of the invention. This means that at least part of the periphery of the semiconductor wafer lying in the direction of flow of the etchant is shielded. The effect of the shielding on the flatness of the side faces of the semiconductor wafer is at its greatest, however, if the periphery of the semiconductor wafer which lies in the direction of flow of the etchant is completely shielded in the manner of the invention. This option is therefore also particularly preferred. On the other hand, it is also possible for the periphery of the semiconductor wafer to be partially or completely shielded in the manner of the invention beyond the minimum requirement.

It can be seen from FIG. 2 that increased removal of material is registered in the edge region of the semiconductor wafer 1, in particular in the range from R-1 mm to R-4 mm. This results in a more or less pronounced deviation from an ideally planar surface, which it is intended to approach with a view to the flatness during the shaping of the front surface and the back surface as a model, in this region. Since this deviation can also only be eliminated to a limited extent by subsequent polishing, it is desirable for this deviation after the etching step to be minimized.

This is achieved by the process according to the invention, as can be seen from FIG. 3, by the boundary 4 of the semiconductor wafer which faces the flow of etchant being shielded in a direction perpendicular to the direction of flow of the etchant along a distance which is at least d+100 μm long, where d denotes the thickness of the semiconductor wafer. With regard to the system of coordinates shown, this means that the etchant, before it reaches the boundary of the semiconductor wafer, is prevented from flowing onto the semiconductor wafer in the radial direction, with the obstacle in the vertical direction of the system of coordinates existing at least over a length corresponding to the sum of the thickness d of the semiconductor wafer and a distance of 100 μm. To achieve this, a shield 5 is arranged in front of boundary 4 of the semiconductor wafer, for example in the manner presented in the above-mentioned EP 1119031 A2. However, unlike in this prior art, it should be noted that the shield must have a thickness which satisfies the requirement that the flow of the etchant be blocked over a length corresponding to the sum of the thickness d of the semiconductor wafer and a distance of 100 μm.

An arrangement of the semiconductor wafer and the shield which is in accordance with the general illustration shown in FIG. 3 is particularly preferred. The thickness d of semiconductor wafer 1 corresponds to the distance between front surface 2 and back surface 3 of the semiconductor wafer. The profile extends from the inner profile end E over a length p to the edge R of the semiconductor wafer. Shield 5 has a rear border located furthest from the boundary of the semiconductor wafer and a border S located closest to the boundary of the semiconductor wafer. Border S is at a distance Δ, the size of which is preferably 10 mm or less, from inner profile end E. In accordance with the sectional illustration shown, the rear border may be straight or rounded with respect to the vertical direction of the system of coordinates. Furthermore, the body of shield 5 may have a rectangular periphery, in accordance with the sectional illustration, with a constant thickness $t_{max}$, or, in accordance with the option indicated by dashed lines, may be designed so as to taper toward one or both borders. The degree of tapering may range between thickness $t_{max}$ and a minimum thickness $t_{min}$.

At border S, the shield may have a recess 6 which is formed in the radial direction and extends down to a depth γ to a base G of the recess. If this feature is present, it is particularly preferred for the relative position of the semiconductor wafer and the shield to be selected in such a way that the boundary of the semiconductor wafer extends into the recess, for example even to such an extent that the difference E-S becomes negative. The length of the shield, i.e. the distance between the border S and the rear border, is preferably 5 to 200 mm, particularly preferably 30 to 70 mm.

A semiconductor wafer which has been etched in accordance with the invention is distinguished by the fact that its side faces are particularly planar even in the edge region. This naturally also has positive effects on the result of subsequent polishing of the semiconductor wafer, since the flatness of the semiconductor wafer is improved still further as a result. The subsequent polishing and any cleaning steps carried out before and after it are to be carried out in accordance with the prior art. At least one polishing of at least the front surface of the semiconductor wafer is carried out. The polishing can be carried out as single-side polishing or as double-side polishing. In the case of single-side polishing of the front surface, the back surface of the semiconductor wafer is fixed on a support plate, for example by adhesive bonding. In the case of double-side polishing, the semiconductor wafer lies in a freely moveable manner in a recess in a carrier. The high flatness of the back surface, even in its edge region, ensures that the polishing of the front surface produces a semiconductor wafer which is extremely planar on this surface all the way into the edge region. Such a successful polishing result can scarcely be achieved with a semiconductor wafer which has been etched in accordance with the prior art and is less planar in the edge region of the side faces, since the locally reduced flatness in the edge region of the back surface is transferred to the front surface, where it also leads to deviations from the ideal plane.

If the front surface is polished a number of times, it is expedient for the first polishing step to be carried out as stock removal polishing and for the final polishing step to be carried out as touch polishing, these two varieties of polishing being distinguished substantially by the amount of material removed during the polishing. In the case of touch polishing, the material removed is generally 2 μm or less and in the case of stock removal polishing, the material removed may be up to 10 mm and above. In addition to the final polishing step, the semiconductor wafer can also be coated, for example by an epitaxial layer being deposited on the front surface and/or by the back surface being sealed with a layer of polycrystalline material and/or with an oxide layer.

A particularly preferred process sequence for production of the claimed semiconductor wafer comprises the separation of the semiconductor wafer by sawing a single crystal, the rounding of the boundary of the semiconductor wafer, if appropriate the grinding of the semiconductor wafer, which may be carried out as single-side grinding or sequential or simultaneous double-side grinding, and/or the lapping, wet-chemical etching, if appropriate edge polishing, and polishing, which is carried out at least once, of the semiconductor wafer, cleaning steps carried out between the processes and one or more coating operations which are carried out following the final polishing of a side face.

COMPARATIVE EXAMPLE

A large number of silicon semiconductor wafers were sawn from a single crystal with the aid of a wire saw, cleaned and subjected to edge rounding. Then, the semiconductor wafers were ground, lapped and etched in groups, rotating, in a bath of an acidic etchant enriched with small gas bubbles. The boundaries of the semiconductor wafers were in each case shielded by a shield which prevented the etchant from being able to flow directly onto the boundary. The arrangement of a semiconductor wafer and its shield is sketched in FIG. 5. In this Comparative Example, which forms part of the prior art, the shield had a rectangular cross section with a thickness $t_{max}$ which corresponded to the thickness d of the semiconductor wafer.

Examples 1 to 8

Other groups of semiconductor wafers of the same type as those used in the Comparative Example were etched under the same conditions, except that the shield used was designed in accordance with the general embodiment shown in FIG. 3. The embodiments used specifically are sketched in FIGS. 6 to 12.

The table given below summarizes the essential features of the arrangements used in the Comparative Example and in the Examples:

TABLE 1

|  | Δ (μm) | γ (μm) | $t_{max}$ − d (μm) | $t_{min}$ − d (μm) | Tapering a | Tapering b | Shield Rounding |
|---|---|---|---|---|---|---|---|
| Comparative example | 350 + ρ | 0 | 0 | 0 | no | no | no |
| Example 1 | 350 + ρ | 0 | 100 | 100 | no | no | no |
| Example 2 | 350 + ρ | 0 | 950 | 950 | no | no | no |
| Example 3 | 100 | 450+ ρ | 1250 | 1250 | no | no | no |
| Example 4 | 0 | 350+ ρ | 1250 | 1250 | no | no | no |
| Example 5 | 0 | 350+ ρ | 1250 | 1250 | no | no | yes |
| Example 6 | 0 | 350+ ρ | 1250 | 100 | yes | no | no |
| Example 7 | 0 | 350+ ρ | 1250 | 100 | yes | no | yes |
| Example 8 | 0 | 350+ ρ | 1250 | 100 | yes | yes | yes |

Following the etching step, all of the groups of semiconductor wafers were cleaned and subjected to single-side polishing on the front surface. FIG. 4 compares the results of a test on the flatness of the back surface of the semiconductor wafers in the edge region for the semiconductor wafers of the Comparative Example and of Examples 1 to 3 in diagram form. It is clear that the semiconductor wafers which were treated in accordance with the prior art did not achieve the criterion that the maximum deviation of the flatness of the back surface from an ideal plane in a range between R-6 mm and R-1 mm of the back surface be 0.7 μm or less.

The table given below provides information on measurements (capacitive measuring method, ADE9900, E+ mode) of the local flatness of the semiconductor wafers of the Comparative Example and of Examples 1, 2 and 3, expressed as SFQR 95%. The grid on which the measurements were based comprised squares (sites) with an area of 22 mm×22 mm, and the edge exclusion was 1 mm. The data show that when the process according to the invention is used, it is possible to count on a significantly improved yield of particularly planar semiconductor wafers. Semiconductor wafers of this type are optimally suited to use in the ≦0.1 μm technology.

TABLE 2

|  | Comparative Example | example 1 | example 2 | example 3 |
|---|---|---|---|---|
| SFQR 95% (μm) After etching | 1.91 | 1.35 | 1.05 | 0.62 |
| SFQR 95% (μm) After polishing | 0.82 | 0.65 | 0.47 | 0.26 |

Accordingly, while only a few embodiments of the present invention have been shown and described, it is obvious that many changes and modifications may be made thereunto without departing from the spirit and scope of the invention.

What is claimed is:

1. A process for producing an etched and polished semiconductor wafer having a front surface, a back surface, and an edge, and a radius R extending from the center to the edge of the semiconductor wafer, comprising:
   treating the semiconductor wafer with a liquid etchant, wherein a flow etchant is directed towards the edge of the semiconductor wafer;
   at least partially shielding the edge of the semiconductor wafer from being struck directly by the flow of etchant along a distance extending in the direction of a thickness d of the semiconductor wafer, the distance having a length of at least d+100 μm and exceeding the levels of the front surface and the back surface of the semiconductor wafer; and polishing of at least a front surface of the semiconductor wafer, wherein partially shielding the edge of the semiconductor wafer comprises positioning a shield in front of the edge of the semiconductor wafer, wherein the shield does not contact the semiconductor wafer and has having a border S at a distance Δ from an inner profile end E of the edge of the semiconductor wafer.

2. The process according to claim 1, wherein the distance Δ is at most 10 mm.

3. The process according to claim 1, wherein the border S has a recess extending down to a depth γ to a base G of the recess, and the edge of the semiconductor wafer extending into the recess.

4. The process according to claim 1, wherein a border of the shield which is furthest from the edge of the semiconductor wafer is rounded.

5. The process according to claim 1, wherein the shield has a tapered body.

6. The process of claim 1, wherein the etched and polished semiconductor wafer has a maximum deviation from flatness of the back surface from an ideal plane at a peripheral region between R-6 mm and R-1 mm of 0.7 μm or less.

7. The process of claim 6, wherein the maximum deviation is 0.5 μm or less.

8. The process of claim 1, wherein the wafer front surface comprises an epitaxially deposited layer.

* * * * *